(12) United States Patent
van de Ven et al.

(10) Patent No.: US 8,921,876 B2
(45) Date of Patent: Dec. 30, 2014

(54) LIGHTING DEVICES WITH DISCRETE LUMIPHOR-BEARING REGIONS WITHIN OR ON A SURFACE OF REMOTE ELEMENTS

(75) Inventors: Antony P. van de Ven, Hong Kong (HK); Gerald H. Negley, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 81 days.

(21) Appl. No.: 12/476,356

(22) Filed: Jun. 2, 2009

(65) Prior Publication Data

US 2010/0301360 A1    Dec. 2, 2010

(51) Int. Cl.
| | |
|---|---|
| H01L 33/00 | (2010.01) |
| F21V 3/04 | (2006.01) |
| F21K 99/00 | (2010.01) |
| F21V 3/02 | (2006.01) |
| H01L 33/60 | (2010.01) |
| F21Y 101/02 | (2006.01) |
| H01L 25/075 | (2006.01) |
| H01L 33/50 | (2010.01) |
| H01L 33/58 | (2010.01) |

(52) U.S. Cl.
CPC ............... H01L 33/507 (2013.01); *H01L 33/60* (2013.01); *H01L 2224/48247* (2013.01); *F21V 3/0481* (2013.01); *F21K 9/135* (2013.01); *H01L 2224/32245* (2013.01); *F21Y 2101/02* (2013.01); *H01L 2224/48091* (2013.01); *H01L 2224/73265* (2013.01); *F21K 9/56* (2013.01); *H01L 25/0753* (2013.01); *F21V 3/02* (2013.01); *H01L 2224/8592* (2013.01); *H01L 33/505* (2013.01); *H01L 33/504* (2013.01); *H01L 33/50* (2013.01); *H01L 33/58* (2013.01)

USPC ............... 257/98; 257/E33.061; 257/E33.073

(58) Field of Classification Search
USPC .............................. 257/98, E33.061, E33.073
See application file for complete search history.

(56) References Cited

U.S. PATENT DOCUMENTS

| | | |
|---|---|---|
| 3,805,937 A | 4/1974 | Hatanaka et al. |
| 3,875,456 A | 4/1975 | Kano et al. |

(Continued)

FOREIGN PATENT DOCUMENTS

| | | |
|---|---|---|
| CN | 1767216 A | 5/2006 |
| CN | 1910762 A | 2/2007 |

(Continued)

OTHER PUBLICATIONS

"Refraction, Snell's law, and total internal reflection," Boston University physics lecture notes, 1998.*

(Continued)

*Primary Examiner* — Matthew Reames
(74) *Attorney, Agent, or Firm* — Myers Bigel Sibley & Sajovec (57) ABSTRACT

A lighting device includes a semiconductor light emitting device (LED) configured to emit light having a first peak wavelength upon the application of a voltage thereto, an element in adjacent, spaced-apart relationship with the LED, and a pattern of discrete lumiphor-containing regions on a surface of, or within, the element. The lumiphor-containing regions are configured to receive light emitted by the LED and convert at least a portion of the received light to light having a longer wavelength than the first peak wavelength. The remote element may be a lens, a reflective element, or a combination thereof.

16 Claims, 6 Drawing Sheets

(56) References Cited

U.S. PATENT DOCUMENTS

| | | |
|---|---|---|
| 3,927,290 A | 12/1975 | Denley |
| 4,120,026 A | 10/1978 | Tsuchihashi et al. |
| 4,325,146 A | 4/1982 | Lennington |
| 4,408,157 A | 10/1983 | Beaubien |
| 4,420,398 A | 12/1983 | Castino |
| 4,710,699 A | 12/1987 | Miyamoto |
| 4,772,885 A | 9/1988 | Uehara et al. |
| 4,918,497 A | 4/1990 | Edmond |
| 4,966,862 A | 10/1990 | Edmond |
| 5,027,168 A | 6/1991 | Edmond |
| 5,087,883 A | 2/1992 | Hoffman |
| 5,166,815 A | 11/1992 | Elderfield |
| 5,210,051 A | 5/1993 | Carter et al. |
| 5,264,997 A | 11/1993 | Hutchisson et al. |
| 5,338,944 A | 8/1994 | Edmond et al. |
| 5,393,993 A | 2/1995 | Edmond et al. |
| 5,407,799 A | 4/1995 | Studier |
| 5,410,519 A | 4/1995 | Hall et al. |
| 5,416,342 A | 5/1995 | Edmond et al. |
| 5,477,436 A | 12/1995 | Betling et al. |
| 5,523,589 A | 6/1996 | Edmond et al. |
| 5,563,849 A | 10/1996 | Hall et al. |
| 5,604,135 A | 2/1997 | Edmond et al. |
| 5,631,190 A | 5/1997 | Negley |
| 5,739,554 A | 4/1998 | Edmond et al. |
| 5,779,924 A | 7/1998 | Krames et al. |
| 5,803,579 A | 9/1998 | Turnbull et al. |
| 5,851,063 A | 12/1998 | Doughty et al. |
| 5,912,477 A | 6/1999 | Negley |
| 5,959,316 A | 9/1999 | Lowery |
| 6,043,509 A | 3/2000 | Kurihara et al. |
| 6,066,861 A | 5/2000 | Hohn et al. |
| 6,071,795 A | 6/2000 | Cheung et al. |
| 6,076,936 A | 6/2000 | George |
| 6,084,250 A | 7/2000 | Justel et al. |
| 6,095,666 A | 8/2000 | Salam |
| 6,120,600 A | 9/2000 | Edmond et al. |
| 6,132,072 A | 10/2000 | Turnbull et al. |
| 6,144,429 A | 11/2000 | Nakai et al. |
| 6,187,606 B1 | 2/2001 | Edmond et al. |
| 6,201,262 B1 | 3/2001 | Edmond et al. |
| 6,212,213 B1 | 4/2001 | Weber et al. |
| 6,234,648 B1 | 5/2001 | Borner et al. |
| 6,252,254 B1 | 6/2001 | Soules |
| 6,255,670 B1 | 7/2001 | Srivastava et al. |
| 6,278,135 B1 | 8/2001 | Srivastava et al. |
| 6,292,901 B1 | 9/2001 | Lys et al. |
| 6,294,800 B1 | 9/2001 | Duggal et al. |
| 6,319,425 B1 | 11/2001 | Tasaki et al. |
| 6,329,676 B1 | 12/2001 | Takayama et al. |
| 6,335,538 B1 | 1/2002 | Prutchi et al. |
| 6,337,536 B1 | 1/2002 | Matsubara et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,373,188 B1 | 4/2002 | Johnson et al. |
| 6,394,621 B1 | 5/2002 | Hanewinkel |
| 6,420,199 B1 | 7/2002 | Coman et al. |
| 6,429,583 B1 | 8/2002 | Levinson et al. |
| 6,441,558 B1 | 8/2002 | Muthu et al. |
| 6,480,299 B1 | 11/2002 | Drakopoulos et al. |
| 6,501,100 B1 | 12/2002 | Srivastava et al. |
| 6,504,179 B1 | 1/2003 | Ellens et al. |
| 6,504,180 B1 | 1/2003 | Heremans et al. |
| 6,513,949 B1 | 2/2003 | Marshall et al. |
| 6,522,065 B1 | 2/2003 | Srivastava et al. |
| 6,538,371 B1 | 3/2003 | Duggal et al. |
| 6,547,249 B2 | 4/2003 | Collins, III et al. |
| 6,550,949 B1 | 4/2003 | Bauer et al. |
| 6,552,495 B1 | 4/2003 | Chang |
| 6,559,075 B1 | 5/2003 | Kelly et al. |
| 6,577,073 B2 | 6/2003 | Shimizu et al. |
| 6,578,986 B2 | 6/2003 | Swaris et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Mueller-Mach et al. |
| 6,608,485 B2 | 8/2003 | St-Germain |
| 6,616,862 B2 | 9/2003 | Srivastava et al. |
| 6,624,350 B2 | 9/2003 | Nixon et al. |
| 6,635,503 B2 | 10/2003 | Andrews et al. |
| 6,636,003 B2 | 10/2003 | Rahm et al. |
| 6,642,666 B1 | 11/2003 | St-Germain |
| 6,657,236 B1 | 12/2003 | Thibeault et al. |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,712,486 B1 | 3/2004 | Popovich et al. |
| 6,737,801 B2 | 5/2004 | Ragle |
| 6,744,194 B2 | 6/2004 | Fukasawa et al. |
| 6,762,563 B2 | 7/2004 | St-Germain et al. |
| 6,784,463 B2 | 8/2004 | Camras et al. |
| 6,791,257 B1 | 9/2004 | Sato et al. |
| 6,791,259 B1 | 9/2004 | Stokes et al. |
| 6,800,500 B2 | 10/2004 | Coman et al. |
| 6,817,735 B2 | 11/2004 | Shimizu et al. |
| 6,841,804 B1 | 1/2005 | Chen et al. |
| 6,851,834 B2 | 2/2005 | Leysath |
| 6,880,954 B2 | 4/2005 | Ollett et al. |
| 6,882,101 B2 | 4/2005 | Ragle |
| 6,885,035 B2 | 4/2005 | Bhat et al. |
| 6,914,267 B2 | 7/2005 | Fukasawa et al. |
| 6,936,857 B2 | 8/2005 | Doxsee et al. |
| 6,943,380 B2 | 9/2005 | Ota et al. |
| 6,957,899 B2 | 10/2005 | Jiang et al. |
| 6,958,093 B2 | 10/2005 | Vaudo et al. |
| 6,967,116 B2 | 11/2005 | Negley |
| 6,980,176 B2 | 12/2005 | Matsumoto et al. |
| 7,005,679 B2 | 2/2006 | Tarsa et al. |
| 7,008,078 B2 | 3/2006 | Shimizu et al. |
| 7,009,199 B2 | 3/2006 | Hall |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,061,454 B2 | 6/2006 | Sasuga et al. |
| 7,066,623 B2 | 6/2006 | Lee et al. |
| 7,083,302 B2 | 8/2006 | Chen et al. |
| 7,093,958 B2 | 8/2006 | Coushaine |
| 7,095,056 B2 | 8/2006 | Vitta et al. |
| 7,102,172 B2 | 9/2006 | Lynch et al. |
| 7,116,308 B1 | 10/2006 | Heeks et al. |
| 7,118,262 B2 | 10/2006 | Negley et al. |
| 7,125,143 B2 | 10/2006 | Hacker |
| 7,135,664 B2 | 11/2006 | Vornsand et al. |
| 7,164,231 B2 | 1/2007 | Choi et al. |
| 7,195,944 B2 | 3/2007 | Tran et al. |
| 7,202,181 B2 | 4/2007 | Negley |
| 7,207,691 B2 | 4/2007 | Lee et al. |
| 7,213,940 B1 | 5/2007 | Van De Ven et al. |
| 7,213,942 B2 | 5/2007 | Jiang et al. |
| 7,215,074 B2 | 5/2007 | Shimizu et al. |
| 7,217,583 B2 | 5/2007 | Negley et al. |
| 7,221,044 B2 | 5/2007 | Fan et al. |
| 7,232,212 B2 | 6/2007 | Iwase |
| 7,239,085 B2 | 7/2007 | Kawamura |
| 7,250,715 B2 | 7/2007 | Mueller et al. |
| 7,255,457 B2 | 8/2007 | Ducharme et al. |
| 7,256,557 B2 | 8/2007 | Lim et al. |
| 7,268,370 B2 | 9/2007 | Ueda |
| 7,291,529 B2 | 11/2007 | Slater, Jr. et al. |
| 7,322,732 B2 | 1/2008 | Negley et al. |
| 7,329,024 B2 | 2/2008 | Lynch et al. |
| 7,341,878 B2 | 3/2008 | Krames et al. |
| 7,358,954 B2 | 4/2008 | Negley et al. |
| 7,365,485 B2 | 4/2008 | Fukasawa et al. |
| 7,372,198 B2 | 5/2008 | Negley |
| 7,387,405 B2 | 6/2008 | Ducharme et al. |
| 7,419,912 B2 | 9/2008 | Donofrio |
| 7,420,221 B2 | 9/2008 | Nagai |
| 7,422,504 B2 | 9/2008 | Maeda et al. |
| 7,453,195 B2 | 11/2008 | Radkov |
| 7,474,044 B2 | 1/2009 | Ge |
| 7,582,906 B2 | 9/2009 | Kurihara |

(56) References Cited

U.S. PATENT DOCUMENTS

| | | |
|---|---|---|
| 2001/0002049 A1 | 5/2001 | Reeh et al. |
| 2002/0006044 A1 | 1/2002 | Harbers et al. |
| 2002/0015013 A1 | 2/2002 | Ragle |
| 2002/0070681 A1 | 6/2002 | Shimizu et al. |
| 2002/0087532 A1 | 7/2002 | Barritz et al. |
| 2002/0123164 A1 | 9/2002 | Slater et al. |
| 2002/0149576 A1 | 10/2002 | Tanaka et al. |
| 2003/0006418 A1 | 1/2003 | Emerson et al. |
| 2003/0026096 A1 | 2/2003 | Ellens et al. |
| 2003/0030063 A1 | 2/2003 | Sosniak |
| 2003/0042908 A1 | 3/2003 | St-Germain |
| 2003/0042914 A1 | 3/2003 | St-Germain |
| 2003/0067302 A1 | 4/2003 | St-Germain |
| 2003/0067773 A1 | 4/2003 | Marshall et al. |
| 2003/0089918 A1 | 5/2003 | Hiller et al. |
| 2003/0146411 A1 | 8/2003 | Srivastava et al. |
| 2003/0209997 A1 | 11/2003 | St-Germain et al. |
| 2003/0222268 A1 | 12/2003 | Yocom et al. |
| 2004/0046178 A1 | 3/2004 | Sano |
| 2004/0051111 A1 | 3/2004 | Ota et al. |
| 2004/0056260 A1 | 3/2004 | Slater et al. |
| 2004/0105264 A1 | 6/2004 | Spero |
| 2004/0212998 A1 | 10/2004 | Mohacsi |
| 2004/0218387 A1 | 11/2004 | Gerlach |
| 2004/0218388 A1 | 11/2004 | Suzuki |
| 2004/0222735 A1 | 11/2004 | Ragle |
| 2004/0239839 A1 | 12/2004 | Hong |
| 2004/0264193 A1 | 12/2004 | Okumura |
| 2004/0264212 A1 | 12/2004 | Chung et al. |
| 2005/0006659 A1 | 1/2005 | Ng et al. |
| 2005/0007306 A1 | 1/2005 | Iisaka et al. |
| 2005/0051790 A1 | 3/2005 | Ueda |
| 2005/0052378 A1 | 3/2005 | Hacker |
| 2005/0093004 A1 | 5/2005 | Yoo |
| 2005/0116635 A1 | 6/2005 | Walson et al. |
| 2005/0133808 A1 | 6/2005 | Uraya et al. |
| 2005/0184638 A1 | 8/2005 | Mueller et al. |
| 2005/0190141 A1 | 9/2005 | Roth et al. |
| 2005/0231976 A1 | 10/2005 | Keuper et al. |
| 2005/0243556 A1 | 11/2005 | Lynch |
| 2005/0251698 A1 | 11/2005 | Lynch et al. |
| 2005/0253151 A1 | 11/2005 | Sakai et al. |
| 2005/0259423 A1 | 11/2005 | Heuser et al. |
| 2005/0274972 A1 | 12/2005 | Roth et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0067073 A1 | 3/2006 | Ting |
| 2006/0090790 A1 | 5/2006 | Kobayashi et al. |
| 2006/0105482 A1 | 5/2006 | Alferink et al. |
| 2006/0105485 A1 | 5/2006 | Basin et al. |
| 2006/0113548 A1 | 6/2006 | Chen et al. |
| 2006/0124953 A1 | 6/2006 | Negley et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0152172 A9 | 7/2006 | Mueller et al. |
| 2006/0180818 A1 | 8/2006 | Nagai et al. |
| 2006/0181192 A1 | 8/2006 | Radkov et al. |
| 2006/0226759 A1 | 10/2006 | Masuda et al. |
| 2006/0245184 A1 | 11/2006 | Galli |
| 2007/0001188 A1 | 1/2007 | Lee |
| 2007/0001994 A1 | 1/2007 | Roth |
| 2007/0041220 A1 | 2/2007 | Lynch |
| 2007/0051966 A1 | 3/2007 | Higashi et al. |
| 2007/0069663 A1 | 3/2007 | Burdalski et al. |
| 2007/0090381 A1 | 4/2007 | Otsuka et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley |
| 2007/0170447 A1 | 7/2007 | Negley |
| 2007/0171145 A1 | 7/2007 | Coleman et al. |
| 2007/0176193 A1 | 8/2007 | Nagai |
| 2007/0202623 A1 | 8/2007 | Gao |
| 2007/0223219 A1 | 9/2007 | Medendorp et al. |
| 2007/0229736 A1 * | 10/2007 | Wang et al. .................. 349/106 |
| 2007/0236911 A1 | 10/2007 | Negley |
| 2007/0247414 A1 | 10/2007 | Roberts |
| 2007/0247847 A1 | 10/2007 | Villard |
| 2007/0262337 A1 | 11/2007 | Villard |
| 2007/0263393 A1 | 11/2007 | Van De Ven et al. |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279440 A1 | 12/2007 | Negley |
| 2007/0279903 A1 | 12/2007 | Negley |
| 2007/0280624 A1 | 12/2007 | Negley et al. |
| 2008/0074032 A1 | 3/2008 | Yano et al. |
| 2008/0084685 A1 | 4/2008 | Van De Ven |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0106895 A1 | 5/2008 | Van De Ven |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0130265 A1 | 6/2008 | Negley |
| 2008/0130285 A1 | 6/2008 | Negley |
| 2008/0136313 A1 | 6/2008 | Negley |
| 2008/0137347 A1 | 6/2008 | Trott et al. |
| 2008/0158480 A1 * | 7/2008 | Ii et al. .................. 349/71 |
| 2008/0170396 A1 | 7/2008 | Yuan et al. |
| 2008/0179602 A1 | 7/2008 | Negley |
| 2008/0192462 A1 | 8/2008 | Steedly et al. |
| 2008/0192493 A1 | 8/2008 | Villard |
| 2008/0211416 A1 | 9/2008 | Negley et al. |
| 2008/0231201 A1 | 9/2008 | Higley et al. |
| 2008/0259589 A1 | 10/2008 | Van De Ven et al. |
| 2008/0278928 A1 | 11/2008 | Van De Ven et al. |
| 2008/0278940 A1 | 11/2008 | Van De Ven et al. |
| 2008/0278950 A1 | 11/2008 | Pickard et al. |
| 2008/0278952 A1 | 11/2008 | Trott et al. |
| 2008/0304250 A1 * | 12/2008 | Harbers et al. .................. 362/84 |
| 2008/0304260 A1 | 12/2008 | Van De Ven et al. |
| 2008/0304261 A1 | 12/2008 | Van De Ven et al. |
| 2008/0304269 A1 | 12/2008 | Pickard et al. |
| 2008/0309255 A1 | 12/2008 | Myers |
| 2008/0310154 A1 | 12/2008 | Van De Ven et al. |
| 2009/0002986 A1 | 1/2009 | Medendorp et al. |
| 2009/0086475 A1 | 4/2009 | Caruso et al. |
| 2009/0101930 A1 | 4/2009 | Li |
| 2009/0108269 A1 | 4/2009 | Negley et al. |
| 2010/0109575 A1 | 5/2010 | Ansems et al. |

FOREIGN PATENT DOCUMENTS

| | | |
|---|---|---|
| DE | 3 916 875 | 12/1990 |
| DE | 3916875 | 12/1990 |
| DE | 10-335077 | 3/2005 |
| EP | 0 838 866 | 4/1998 |
| EP | 0 971 421 | 1/2000 |
| EP | 1 024 399 | 8/2000 |
| EP | 1 081 771 | 3/2001 |
| EP | 1 160 883 | 12/2001 |
| EP | 1 193 772 | 4/2002 |
| EP | 1 263 058 | 12/2002 |
| EP | 1 367 655 | 12/2003 |
| EP | 1 380 876 | 1/2004 |
| EP | 1 462 711 | 12/2004 |
| EP | 1 566 848 | 8/2005 |
| EP | 1 566 848 A2 | 8/2005 |
| EP | 1 571 715 | 9/2005 |
| EP | 1 571 715 A1 | 9/2005 |
| EP | 1 760 795 | 1/2006 |
| EP | 1 760 795 A2 | 3/2007 |
| JP | 04-159519 | 6/1992 |
| JP | 09-146089 | 6/1997 |
| JP | 10-163535 | 6/1998 |

(56) References Cited

FOREIGN PATENT DOCUMENTS

| | | |
|---|---|---|
| JP | 2000-022222 | 1/2000 |
| JP | 2000-183408 | 6/2000 |
| JP | 2001-111114 | 4/2001 |
| JP | 2001-156331 | 6/2001 |
| JP | 2001-307506 | 11/2001 |
| JP | 2002-150821 | 5/2002 |
| JP | 2003-515956 | 5/2003 |
| JP | 2004-080046 | 3/2004 |
| JP | 2004-103443 | 4/2004 |
| JP | 2004-253309 | 9/2004 |
| JP | 2004-356116 | 12/2004 |
| JP | 2004-363055 | 12/2004 |
| JP | 2005-005482 | 1/2005 |
| JP | 2005-101296 | 4/2005 |
| JP | 2005-142311 | 6/2005 |
| JP | A-2005-244226 | 9/2005 |
| JP | A-2007-049114 | 2/2007 |
| JP | 2007-122950 | 5/2007 |
| JP | 2007-141737 | 6/2007 |
| JP | A-2008-071793 | 3/2008 |
| TW | 546854 | 8/2003 |
| TW | 200603434 | 1/2006 |
| WO | 98/43014 | 10/1998 |
| WO | 99/66483 | 12/1999 |
| WO | 00/34709 | 6/2000 |
| WO | 01/41215 | 6/2001 |
| WO | 01/43113 | 6/2001 |
| WO | 01/69692 | 9/2001 |
| WO | WO 01/69692 A1 | 9/2001 |
| WO | 03/056876 | 7/2003 |
| WO | 03/091771 | 11/2003 |
| WO | 2004/068909 | 8/2004 |
| WO | 2005/004202 | 1/2005 |
| WO | 2005013365 | 2/2005 |
| WO | 2005/013365 | 10/2005 |
| WO | WO2005-104247 | 11/2005 |
| WO | WO 2005/104253 | 11/2005 |
| WO | 2005/124877 | 12/2005 |
| WO | 2005124877 | 12/2005 |
| WO | 2006/028312 | 3/2006 |
| WO | 2006/061728 A2 | 6/2006 |
| WO | WO 2006/121196 A1 | 11/2006 |
| WO | 2007/061758 | 5/2007 |
| WO | WO 2009/107052 A1 | 9/2009 |
| WO | WO 2009/119034 A1 | 10/2009 |
| WO | WO 2009/136351 A1 | 11/2009 |
| WO | WO 2009/146266 A1 | 12/2009 |
| WO | WO 2010/062525 A1 | 6/2010 |

OTHER PUBLICATIONS

"Reflection and Refraction," University of Sydeny lecture notes, 2011.*

Kim et al. "Strongly Enhanced Phosphor Efficiency in GaInN White Light-Emitting Diodes Using Remote Phosphor Configuration and Diffuse Reflector Cup" *Japanese Journal of Applied Physics* 44(21):L649-L651 (2005).

Notification of Transmittal of the International Search Report and the Written Opinion of the International Searching Authority issued by the European Patent Office on Sep. 27, 2010 for corresponding PCT Application No. PCT/US2010/036583.

Press Release from LED Lighting Fixtures dated May 4, 2007 entitled "LED Lighting Fixtures to Expand Product Line."

Schlotter et al., "Luminescence Conversion of Blue Light Emitting Diodes", App. Phys. A. 64, 417-418 (1997).

Office Action issued in JP Application No. 2011-506258, mailing date Sep. 14, 2012, 9 pages.

International Preliminary Report on Patentability for International Application No. PCT/US2010/036583; Date of Mailing: Oct. 28, 2011; 15 pages.

Chinese Second Office Action Corresponding to Chinese Patent Application No. 200980121269.2; Date of Notification: Dec. 19, 2012; 13 Pages.

Chinese Office Action Corresponding to Chinese Patent Application No. 200980121269.2; Date of Notification: Feb. 13, 2012; 9 pages.

CN Third Office Action issued on Sep. 12, 2013; Corresponding to Chinese Patent Application No. 200980121269.2; 8 pages.

Boehlen et al., "Laser micro-machining of high density optical structures on large substrates," Proc. of SPIE vol. 5339, 2004, pp. 118-126.

Invitation to Pay Additional Fees and, Where Applicable, Protest Fee (7 pages) corresponding to International Application No. PCT/US2008/009234; Mailing Date: Nov. 14, 2008.

International Search Report and Written Opinion (15 pages) corresponding to International Application No. PCT/US2009/002193; Mailing Date: Jul. 20, 2009.

White Light LED, Part Nos. NSPW300BS and NSPW312BS, High Brightness LEDs, Nov. 12, 1999, Publisher: Nichia Corporation.

Chhajed, S., *Influence of junction temperature on chromaticity and color-rendering properties of trichromatic white-light sources. . .* , Journal of Applied Physics, 2005, vol. 97pp. 1-8.

Color Kinetics Inc., Color Kinetics Support : White Papers & Presentations; available at http://www.colorkinetics.com/support/whitepapers/:, Solid State Lighting White Papers & Presentations, Feb. 22, 2006, pp. 1-4.

Color Kinetics Inc., *Color Quality of Intelligent Solid-State Light Systems*, Color Quality of Solid-State Light Sources, Mar. 2005, pp. 1-3.

Compound Semiconductors Online, "LED Lighting Fixtures, Inc. Sets World Record at 80 Lumens per Watt for Warm White", Compound Semiconductors Online, May 30, 2006, pp. 1.

Cree, Inc., "Cree® Xlamp® 7090 XR-E Series LED Binning and Labeling," Application Note: CLD-AP08.000, 7pp (2006).

CSA International, "Test Data Report," Project No. 1786317, Report No. 1786317-1 (Apr. 2006).

DOE SSL CALiPer Report, "Product Test Reference: CALiPER 07-31 Downlight Lamp", 2010.

DOE SSL CALiPer Report, "Product Test Reference: CALiPER 07-47 Downlight Lamp",2010.

Krames et al., *Lumileds Lighting, Light from Silicon Valley*, Progress and Future Direction of LED Technology, SSL Workshop, Nov. 13, 2003, Publisher: Limileds Lighting Inc., pp. 1-21.

Narendran et al., "Solid State lighting: failure analysis of white LEDs," Journal of Cystal Growth, vol. 268, Issues 1-4, Aug. 2004, Abstract.

Narendran et al., *Color Rendering Properties of LED Light Sources*, 2002, pp. 1-8.

Nichia, White Light LED, Part Nos. NSPW300BS and NSPW312BS, High Brightness LEDs, Nov. 12, 1999, Publisher: Nichia Corporation.

Press Release from LED Lighting Fixtures dated Apr. 24, 2006 entitled "LED Lighting Fixtures, Inc. achieves unprecedented gain in light output from new luminaire".

Press Release from LED Lighting Fixtures dated Feb. 16, 2006 entitled "LED Lighting Fixtures, Inc. Announces Record Performance".

Press Release from LED Lighting Fixtures dated Feb. 7, 2007 entitled "LED Lighting Fixtures Announces its first LED-based Recessed Down Light".

Press Release from LED Lighting Fixtures dated Jan. 26, 2006 entitled "LED Lighting Fixtures Creates 750 Lumen Recessed Light and Uses Only 16 Watts of Power".

Press Release from LED Lighting Fixtures dated May 30, 2006 entitled "LED Lighting Fixtures, Inc. Sets World Record at 80 Lumens per Watt for Warm White Fixture".

Press Release from LED Lighting Fixtures dated Nov. 28, 2007 entitled "New Lamp from LED Lighting Fixtures Shatter World Record for Energy Efficiency".

Shimizu, "Development of High-Efficiency LED Downlight", First International Conference on White LEDs and Solid State Lighting, Nov. 30, 2007.

U.S. Department of Energy, "DOE Solid-State Lighting CALiPER Program, Summary of Results: Round 3 of Product Testing," Oct. 2007.

U.S. Department of Energy, "DOE Solid-State Lighting CALiPER Program, Summary of Results: Round 4 of Product Testing," Jan. 2008.

(56) References Cited

OTHER PUBLICATIONS

U.S. Department of Energy, "DOE Solid-State Lighting CALiPER Program, Summary of Results: Round 5 of Product Testing," May 2008.
Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.
DOE SSL CALiPer Report, "Product Test Reference: CALiPER 07-47 Downlight Lamp", 2010.
Optoled Lighting Inc., *OptoLED Product Information*, 2009, Publisher: OptoLED GmBH website: accessed at http://222.optoled.de/ englisch/products/led.html.
Permlight Inc., *Enbryten LED Product Information*, Feb. 2005, Publisher: Permlight Inc. website; accessed at http://www.webarchive. org displaying that www.permlight.com/products/LEDfixtures.asp was publicly available Jan. 2004.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,162, filed May 30, 2007.
U.S. Appl. No. 11/854,744, filed Sep. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 12/017,558, filed Jan. 22, 2008.
U.S. Appl. No. 12/017,600, filed Jan. 22, 2008.
U.S. Appl. No. 12/057,748, filed Mar. 28, 2008.
U.S. Appl. No. 11/743,324, filed May 2, 2007.
U.S. Appl. No. 11/032,363, filed Jan. 10, 2005.
U.S. Appl. No. 61/075,513, filed Jun. 25, 2008.
Taiwan Office Action (and Translation) from corresponding Taiwan Patent Application No. 097102415; Mailing date: Oct. 16, 2013; 18 pages.

\* cited by examiner

LIGHTING DEVICES WITH DISCRETE LUMIPHOR-BEARING REGIONS WITHIN OR ON A SURFACE OF REMOTE ELEMENTS

FIELD OF THE INVENTION

This invention relates to lighting devices, and more particularly to semiconductor light emitting devices including wavelength conversion materials.

BACKGROUND

Light emitting diodes and laser diodes are well known solid state electronic devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer). In other embodiments, a substrate need not be included.

In order to use an LED chip in a circuit, it is known to enclose an LED chip in a package to provide environmental and/or mechanical protection, color selection, focusing and the like. An LED package also includes electrical leads, contacts or traces for electrically connecting the LED package to an external circuit. In a typical LED package 10 illustrated in FIG. 1, an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup 13 may be filled with an encapsulant material 16 containing a wavelength conversion material such as phosphor particles. The entire assembly may then be encapsulated in a clear protective resin 14, which may be molded in the shape of a lens to collimate the light emitted from the LED chip 12. The term "phosphor" is used herein to refer to any materials that absorb light at one wavelength and re-emit light at a different wavelength, regardless of the delay between absorption and re-emission and regardless of the wavelengths involved. Accordingly, the term "phosphor" is used herein to refer to materials that are sometimes called fluorescent and/or phosphorescent. In general, phosphor particles absorb light having low wavelengths and re-emit light having longer wavelengths.

Figure 1:
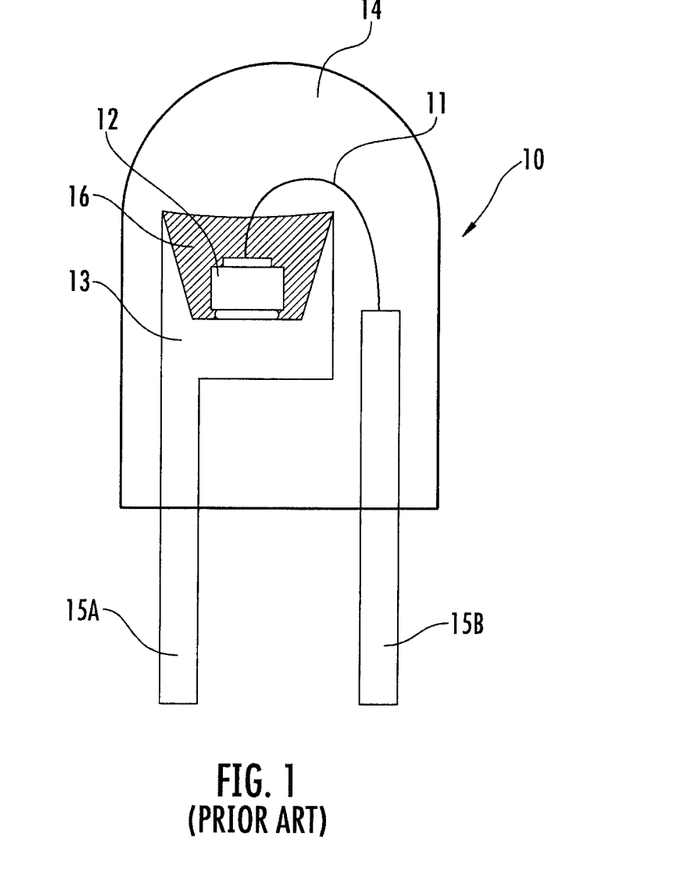
FIG. 1 is a cross-sectional side view illustrating a conventional packaged light emitting device.

Typically, phosphor particles are randomly distributed within the matrix of encapsulant material. Some or all of the light emitted by the LED chip 12 at a first wavelength may be absorbed by the phosphor particles, which may responsively emit light at a second wavelength. For example, a blue-emitting chip may be encapsulated with an encapsulant matrix including a yellow-emitting phosphor. The combination of blue light (from the chip) with yellow light (from the phosphor) may produce a light that appears white. Some red-emitting phosphor particles may be included in the encapsulant matrix to improve the color rendering properties of the light, i.e. to make the light appear more "warm." Similarly, a UV-emitting chip may be encapsulated with an encapsulant material including phosphor particles that individually emit red, green and blue light upon excitation by UV light, The resulting light, which is a combination of red, green and blue light, may appear white and may have good color rendering properties.

However, the deposition of more than one phosphor material on an LED chip may be desirable under certain circumstances. For example, it may be desirable to include a red phosphor along with a yellow phosphor on a blue LED chip to improve the color rendering characteristics of the light produced by the chip. That is, it is known that white emitters including a blue light emitting device and a yellow phosphor may have poor color rendering characteristics due to the binary nature of the emitted light. In order to provide better color rendering, a red phosphor, that may also emit light in response to stimulation by light emitted by the blue LED chip, may provide a red light emission complement to the overall light emitted by the LED chip. The resulting light may have a warmer appearance that may give objects a more natural appearance when illuminated. However, the excitation curve of the red phosphor material may overlap with the emission curve of the yellow emitting phosphor, meaning that some light emitted by the yellow phosphor may be reabsorbed by the red phosphor, which may result in a loss of efficiency. The use of patterns of multiple phosphors on an LED chip is described in U.S. Patent Application Publication No. 2009/0108269, which is incorporated herein by reference, in its entirety.

The junction temperature of phosphor converted LEDs is typically controlled to provide a long life for LEDs. The degradation resulting from the higher temperature may result, at least in part, from temperature degradation of the phosphor and the material the phosphor is bound in, such as silicone, epoxy, etc. To overcome this difficulty, remote phosphor devices have been proposed. One remote phosphor device is the FORTIMO® brand downlight module available from Philips. The Philips remote phosphor device has a lens with phosphor in the lens. The lens is remote from the LED light sources. However, the conventional remote phosphor devices may have the same shortcomings with regard to efficiency as conventional phosphor LEDs.

SUMMARY

Some embodiments of the present invention provide a lighting device that includes a semiconductor light emitting device (LED) configured to emit light having a first peak wavelength upon the application of a voltage thereto, an element in adjacent, spaced-apart relationship with the LED, and a pattern of discrete lumiphor-containing regions on a surface of the element. The lumiphor-containing regions are configured to receive light emitted by the LED and convert at least a portion of the received light to light having a longer wavelength than the first peak wavelength. In some embodiments, the remote element is a lens. In some embodiments, the remote element is a reflective element. In some embodiments, the remote element may be a combination of a lens and reflective element. In some embodiments the lumiphor-containing regions are within the element.

In some embodiments, the pattern of discrete lumiphor-containing regions includes a plurality of first and second lumiphor-containing regions. The first lumiphor-containing region is configured to convert light emitted by the LED to light having a second peak wavelength and the second lumiphor-containing region is configured to convert light emitted by the LED to light having a third peak wavelength, shorter than the second peak wavelength. The first and second discrete lumiphor-containing regions may be spaced apart from one another on the surface of the remote element or may be in adjacent, substantially contacting relationship. In some embodiments, an intermediate material may be located between adjacent ones of the spaced apart first and second discrete lumiphor containing regions. The intermediate material can have a different (e.g., lower, higher) index of refraction than the first discrete lumiphor containing regions. For example, the intermediate material can have a lower index of refraction than the first discrete lumiphor containing regions, and a higher index of refraction than the second discrete lumiphor containing regions.

In some embodiments, the first peak wavelength is a blue or UV wavelength, and the first discrete lumiphor-containing regions comprise a first color phosphor and the second discrete lumiphor containing regions comprise a second color phosphor.

The lighting device may be a component, a module, a self-ballasted lamp or a light fixture.

In other embodiments, a lighting device includes a semiconductor light emitting device (LED) configured to emit light having a first peak wavelength upon the application of a voltage thereto, a lens in adjacent, spaced-apart relationship with the LED, and a pattern of discrete lumiphor-containing regions on a surface of the lens. The pattern of discrete lumiphor-containing regions includes a plurality of first and second lumiphor-containing regions. The first lumiphor-containing region is configured to convert light emitted by the LED to light having a second peak wavelength and the second lumiphor-containing region is configured to convert light emitted by the LED to light having a third peak wavelength, shorter than the second peak wavelength. The first and second discrete lumiphor-containing regions may be spaced apart from one another on the surface of the lens, and may include an intermediate material between adjacent ones of the spaced apart first and second discrete lumiphor containing regions.

In other embodiments, a lighting device includes a semiconductor light emitting device (LED) configured to emit light having a first peak wavelength upon the application of a voltage thereto, a reflective element in adjacent, spaced-apart relationship with the LED, and a pattern of discrete lumiphor-containing regions on a surface of the reflective element. The pattern of discrete lumiphor-containing regions includes a plurality of first and second lumiphor-containing regions. The first lumiphor-containing region is configured to convert light emitted by the LED to light having a second peak wavelength and the second lumiphor-containing region is configured to convert light emitted by the LED to light having a third peak wavelength, shorter than the second peak wavelength. The first and second discrete lumiphor-containing regions may be spaced apart from one another on the surface of the reflective element, and may include an intermediate material between adjacent ones of the spaced apart first and second discrete lumiphor containing regions.

In other embodiments, a lighting device includes a semiconductor light emitting device (LED) configured to emit light having a first peak wavelength upon the application of a voltage thereto, an element, such as a lens, in adjacent, spaced-apart relationship with the LED, and a pattern of discrete lumiphor-containing regions within the element. The lumiphor-containing regions are configured to receive light emitted by the LED and to convert at least a portion of the received light to light having a longer wavelength than the first peak wavelength.

BRIEF DESCRIPTION OF THE DRAWINGS

The accompanying drawings, which are included to provide a further understanding of the invention and are incorporated in and constitute a part of this application, illustrate certain embodiment(s) of the invention.

DETAILED DESCRIPTION

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The term "reflective material" is intended to include materials that are partially reflective.

Various embodiments of the present invention for packaging a semiconductor light emitting device will be described herein. As used herein, the term semiconductor light emitting device may include a light emitting diode, laser diode and/or other semiconductor device which includes one or more semiconductor layers, which may include silicon, silicon carbide, gallium nitride and/or other semiconductor materials. A light emitting device may or may not include a substrate such as a sapphire, silicon, silicon carbide and/or another microelectronic substrate. A light emitting device may include one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein. For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Embodiments of the present invention provide light emitting device structures with discrete lumiphor-bearing regions on a remote surface thereof. The term "discrete" means that the lumiphor-bearing regions are separate, non-overlapping (except for manufacturing tolerances) regions. For example, in some embodiments discrete lumiphor-bearing regions may be provided as a pattern of phosphors on a lens, reflective surface, etc.

As used herein, the term lumiphor refers to a wide variety of luminescent materials including, but not limited to, phosphors, dyes, nanoparticles, crystalline converters, etc., which are well-known to those of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation.

The pattern may be any suitable pattern and may, for example, take into account the efficacy of the particular phosphors used. The amount of phosphor (e.g., the thickness of the phosphor) and the area covered by the phosphor may be selected to provide a desired light output. The selection may be made in advance or may be tuned when the LED device is constructed. The phosphor may be applied using any suitable phosphor deposition technique, such as by inkjet or bubble jet printing, screen deposition or other techniques. Techniques for providing patterned phosphors on glass such as used in making color cathode ray tubes may, for example, be utilized.

In some embodiments, light from the phosphor may pass through the surface (e.g., when the phosphor is on a lens surface). In other embodiments, light from the phosphor may be reflected by the surface (e.g., when the phosphor is on a reflector). In other embodiments, portions of light from the phosphor may pass through a surface and portions may be reflected (e.g., when a lens and reflective surface are used in the LED device.

Embodiments of the present invention can overcome problems with conventional remote phosphor devices by providing patterned remote phosphors where multiple phosphors are provided with little or no overlap between the phosphors. By using patterned remote phosphors, the need for a separate mixing optic may be reduced or eliminated. The size of a phosphor pattern may be kept small such that the light from the different phosphors mixes and appears uniform. Furthermore, the optical loss from a diffuser may be avoided. In addition, optical efficiency of LED devices, according to embodiments of the present invention, may be enhanced since light radiated from one phosphor may not be absorbed by another phosphor due to the separation of the phosphors.

According to some embodiments, the phosphors may be provided on a flame resistant material, such as glass or polycarbonate. In such embodiments, an additional lens for meeting flame rating requirements for luminaires may not be required.

Figure 2:
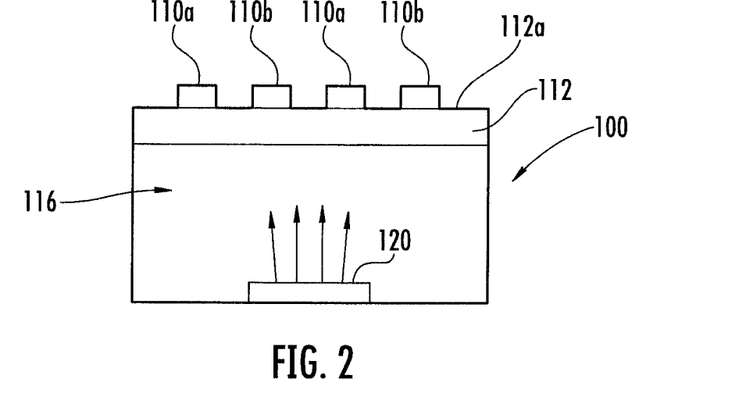
FIG. 2 is a cross sectional view of a light emitting device structure illustrating discrete lumiphor-bearing regions on a remote surface, according to some embodiments of the present invention.
Figure 3:
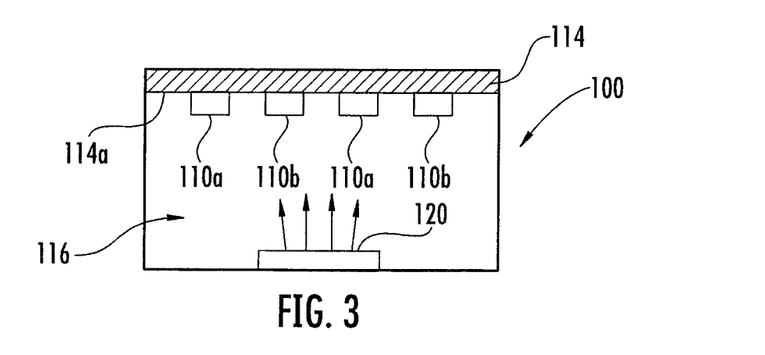
FIG. 3 is a cross sectional view of a light emitting device structure illustrating discrete lumiphor-bearing regions on a remote surface, according to some embodiments of the present invention.

FIGS. 2 and 3 illustrate discrete lumiphor-containing regions 110a, 110b spaced apart laterally across a surface 112a of a light emitting device 100, wherein the surface 112a is remote from an LED excitation source 120. In FIG. 2, the remote surface 112a is the surface of a lens 112 and the lumiphor-containing regions 110a, 110b are spaced apart laterally across the surface 112a of the lens 112. The space 116 between the LED excitation source 120 and the lens 112 may be a vacuum or contain air, gas, encapsulant material, transparent liquid, glass, mineral oxide, crystalline or polycrystalline material, etc. In FIG. 3, the remote surface 114a is the surface of a reflective element 114 and the lumiphor-containing regions 110a, 110b are spaced apart laterally across the reflective surface 114a. The space 116 between the LED excitation source 120 and the reflective element 114 may be a vacuum or contain air, gas, encapsulant material, transparent liquid, glass, mineral oxide, crystalline or polycrystalline material, etc.

Discrete lumiphor-containing regions 110a, 110b can have virtually any shape, configuration, and size. Lumiphor particle size utilized may be dependent upon the printing process utilized. Typically, phosphor particle size range from about 50 microns to about 5 millimeters.

In general, light is emitted by a phosphor when a photon having energy higher than a bandgap of the phosphor material passes through the phosphor and is absorbed. When the photon is absorbed, an electronic carrier in the phosphor is stimulated from a resting state to an excited state. When the electronic carrier decays back to a resting state, a photon can be emitted by the phosphor. However, the emitted photon may have an energy that is less than the energy of the absorbed photon. Thus, the emitted photon may have a wavelength that is longer than the absorbed photon.

The LED excitation source 120 of FIGS. 2 and 3 may be configured to generate light having a first peak wavelength, for example, in the blue or UV region of the visible spectrum. The first lumiphor-containing region 110a is configured to convert light emitted by the LED excitation source 120 to light having a second peak wavelength that is longer than the first peak wavelength. That is, the first lumiphor-containing region 110a is configured to absorb light emitted by the LEDs excitation source 120 and to responsively emit light having a longer wavelength. For example, the first lumiphor-containing region 110a may be configured to emit red light in response to absorbing blue or UV light. The second lumiphor-containing region 110b is configured to absorb light emitted by the LED excitation source 120 and to responsively emit light having a third peak wavelength that is longer than the first peak wavelength (of light emitted by the LED excitation source 120) but that is shorter than the second peak wavelength. For example, the second lumiphor-containing region 110b may be configured to emit yellow, yellow-green or green light in response to absorbing blue or UV light from the LED excitation source 120. As used herein, the term green/yellow includes yellow, yellow-green and/or green.

Suitable red phosphors for embodiments of the present invention include, but are not limited to, Sr2Si5N8:Eu2+, and CaAlSiN3:Eu. Other red phosphors that can be used include, but are not limited to, phosphors from the Eu2+-SiAlON family of phosphors, as well as CaSiN2:Ce3+, CaSiN2:Eu2+ and/or phosphors from the (Ca,Si,Ba)SiO4:Eu2+ (BOSE) family. Suitable yellow phosphors include, but are not limited to, Y3Al5O12:Ce3+ (Ce:YAG), CaAlSiN3:Ce3+, and phosphors from the Eu2+-SiAlON-family, and/or the BOSE family. Suitable green phosphors include, but are not limited to, phosphors from the BOSE family, as well as CaSi2O2N2:Eu2+. The phosphor may also be doped at any suitable level to provide a desired wavelength of light output. In some embodiments, Ce and/or Eu may be doped into a phosphor at a dopant concentration in a range of about 0.1% to about 20%. Suitable phosphors are available from numerous suppliers, including Mitsubishi Chemical Corporation, Tokyo, Japan, Leuchtstoffwerk Breitungen GmbH, Breitungen, Germany, and Intematix Company, Fremont, Calif.

Other suitable phosphors that may be utilized according to embodiments of the present invention include nanocrystals (NCs) with a cadmium selenide (CdSe) core surrounded by a zinc sulfide (ZnS) shell that can convert short wavelengths to longer ones. Such crystals can effectively absorb UV-green light and emit green-red light. The absorption and emission spectra of these NCs can be tuned by controlling the diameter of the CdSe core and the thickness of the ZnS shell. Moreover, the NCs have the advantages of high quantum efficiency and photostability. In particular, mixing the NCs with gold nanoparticles induces coupling between CdSe/ZnS NCs and surface plasmons (SPs) on the gold that can enhance the color conversion efficiency.

As will be appreciated by those of skill in the art in light of the present disclosure, phosphors may also be incorporated with other materials, for example, to provide a protective coating, to provide a coating that secures the phosphors to a surface, etc. In addition, embodiments of the present invention may utilize dyes or any other type of lumiphor that can be "printed" or implanted, for example, as described in Luminescence Conversion of Blue Light Emitting Diodes, P. Schlotter et al., Appl. Phys. A 64, 417-418 (1997), which is incorporated herein by reference in its entirety.

According to some embodiments of the present invention, patterns of discrete metal-organic chemical vapor deposition (MOCVD) deposited crystalline or polycrystalline convertors on a surface of a lens or reflective surface can be utilized. MOCVD deposited crystalline and polycrystalline convertors are described in U.S. Pat. No. 6,337,536, and in U.S. Patent Application Publication No. 2005/0006659, which are incorporated herein by reference in their entireties.

The LED excitation source 120 may be any suitable LED light source that excites phosphor, such as blue LEDs or UV LEDs. However, other types of LED excitation sources may be utilized.

Figure 4A:
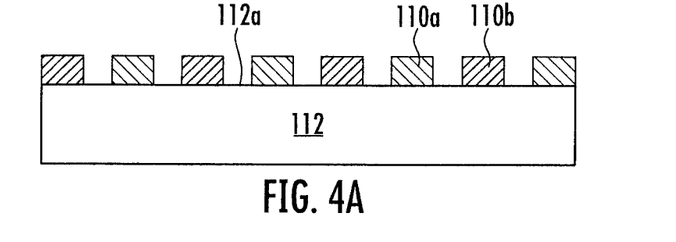
FIGS. 4A-4B are cross sectional views illustrating light emitting device structures including discrete lumiphor-bearing regions that may be utilized according to some embodiments of the invention.

FIGS. 4A-4B and 5A-5B illustrate various ways in which discrete lumiphor-containing regions can be spaced laterally across a remote surface, such as the surface 112a of a remote lens 112, according to some embodiments of the present invention. For example, as shown in FIG. 4A, a plurality of first and second discrete lumiphor-containing regions 110a, 110b are provided on a remote surface 112a. The discrete lumiphor-containing regions 110a, 110b can include different types of phosphors and/or phosphors having different doping levels that are configured to emit different colors of light when stimulated by light within their respective excitation regions.

The first discrete lumiphor-containing regions 110a can be configured to emit longer wavelength light, such as red light, in response to blue or UV light emitted by an LED excitation source 120 (FIG. 2), while the second discrete lumiphor-containing regions 110b can be configured to emit shorter wavelength light, such as green/yellow light, in response to blue or UV light emitted by the LED excitation source 120.

Figure 4B:
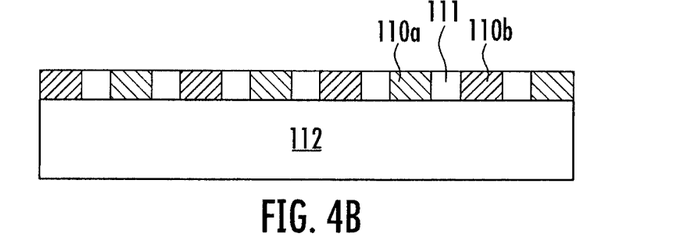

As illustrated in FIGS. 4A and 4B, the first and second discrete lumiphor-containing regions 110a, 110b can be disposed on the remote surface 112a in an alternating manner. However, in some embodiments, two discrete lumiphor-containing regions of the same type can be disposed adjacent one another and may abut or be spaced apart from one another as shown in FIG. 4A.

As shown in FIG. 4B, intermediate regions 111 can be disposed between adjacent ones of the discrete lumiphor-containing regions 110a, 110b. The intermediate regions 111 can be provided to reduce the possibility of light emitted by one discrete lumiphor-containing region passing into another discrete lumiphor-containing region and being reabsorbed therein. In some embodiments, the intermediate regions 111 can have a lower index of refraction than either the first discrete lumiphor-containing regions 110a or the second discrete lumiphor-containing regions 110b. In some embodiments, the intermediate regions 111 can have an index of refraction that is lower than the index of refraction of the second lumiphor-containing regions 110b and that is higher than the index of refraction of the first lumiphor-containing regions 110a. Silicone polymer, which can have an index of refraction of about 1.3 to about 1.55 is a suitable material for forming the intermediate regions 111. The phosphors in the discrete lumiphor-containing regions 110a and 110b can have an index of refraction of about 1.5 to about 2.5.

Figure 6:
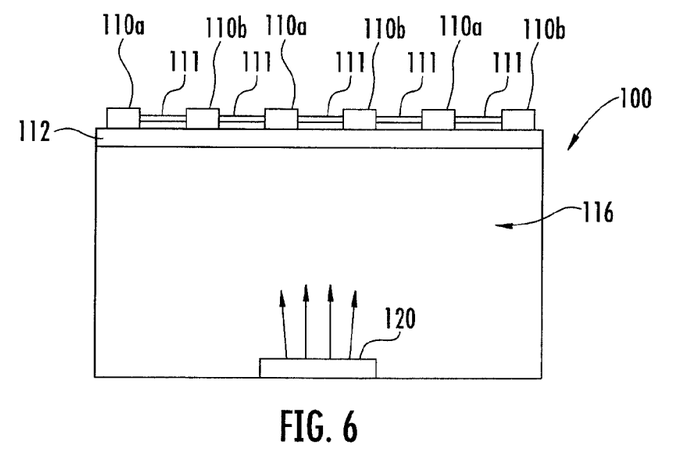
FIG. 6 is a cross sectional view illustrating a light emitting device structure including discrete lumiphor-bearing regions with reflective material disposed therebetween, according to further embodiments of the invention.

In some embodiments, the intermediate regions 111 can include reflective material, as illustrated in FIG. 6. For example, inward facing reflective intermediate regions 111 can reflect some light back into a chamber for color mixing or recycling. In some embodiments, these reflectors could be wavelength selective, diachronic, or tuned reflectors so that, for example, the excitation wavelength is reflected back, whereas the phosphor emitted wavelength can pass through. The use of reflectors and partial reflectors has some efficiency benefit as the phosphor wavelengths are not scattered when they are recycled.

Figure 5A:
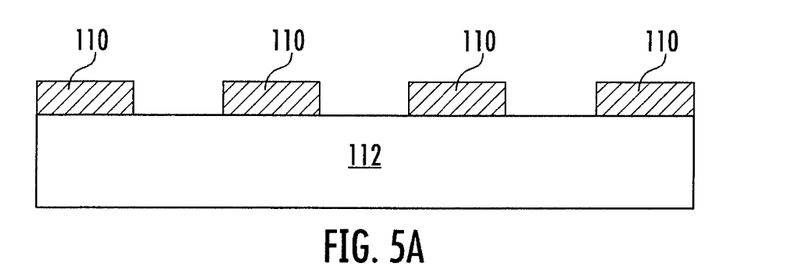
FIGS. 5A-5B are cross sectional views illustrating light emitting device structures including discrete lumiphor-bearing regions that may be utilized according to further embodiments of the invention.

Referring to FIG. 5A, according to some embodiments of the invention, discrete lumiphor-containing regions 110 may be provided on a remote surface 112a at regular and/or irregular intervals. Furthermore, multiple lumiphor-containing regions 110 having different types of phosphors may be provided on the remote surface 112a. The lumiphor-containing regions 110 can abut one another and/or be spaced apart as shown in FIG. 5A.

Figure 5B:
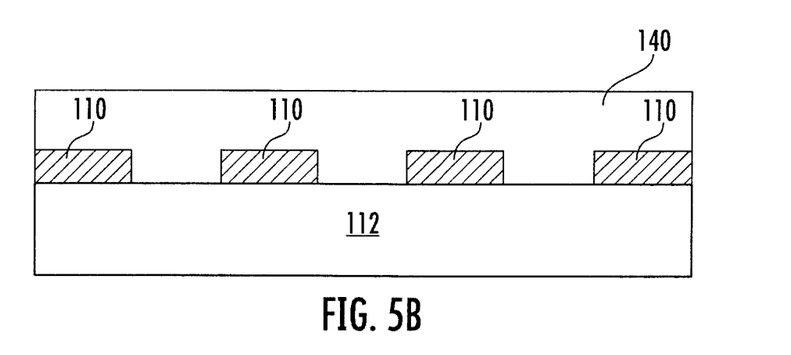

Referring to FIG. 5B, an overlayer 140 may be provided on the LED structure 100 including the discrete lumiphor-containing regions 110. The overlayer 140 may include, for example, a layer of silicone or other encapsulant material, and in some embodiments may include a lumiphor-containing material. In some embodiments, the overlayer 140 may include a different phosphor material from the phosphor material contained in the discrete lumiphor-containing regions 110. For example, the discrete lumiphor-containing regions 110 can include a red phosphor, while the overlayer 140 may include a green/yellow phosphor, or vice versa.

The overlayer 140 may include other materials/structures that can change optical properties of light emitted by the LED structure 120. For example, the overlayer 140 can include optical diffusing/scattering particles and/or the overlayer 140 can be textured and/or patterned to increase optical extraction from the device.

Discrete lumiphor-containing regions provided on a remote surface of an LED structure, according to embodiments of the present invention, may have any desired pattern, such as dots, lines, triangles, hexagons, etc., with any desired periodicity. Further, the discrete lumiphor-containing regions 110 provided on the illustrated remote surface 112a may be in contact with adjacent lumiphor-containing regions and/or may be separated from adjacent lumiphor-containing regions. For example, in a warm white LED application, red and yellow phosphors may be physically separated to reduce reabsorption of yellow light by the red phosphors. The discrete lumiphor-containing regions 110 provided on the remote surface 112a can remain at different thicknesses and/or can be planarized.

Embodiments of the present invention may be utilized in a wide range of illumination devices including, but not limited to, A-lamps, downlights, lay-in fixtures, and the like. FIGS. 7 through 10 illustrate exemplary alternative embodiments of lighting devices according to the present inventive subject matter.

Figure 7:
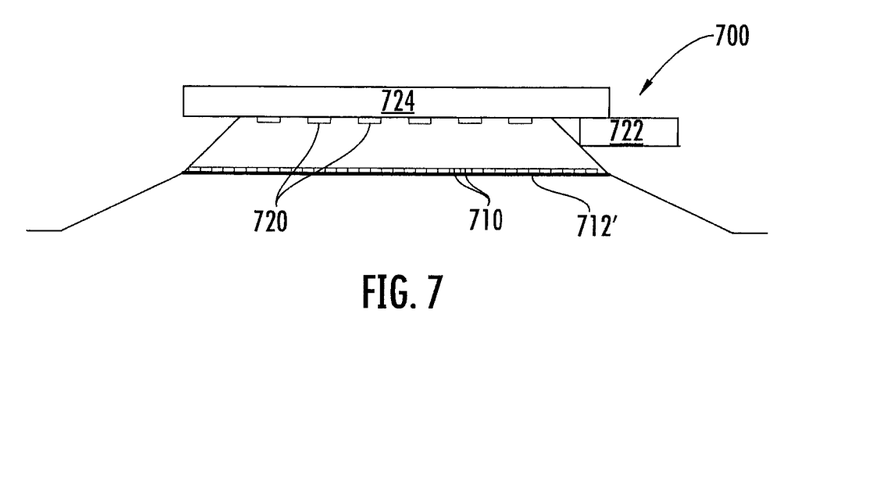
FIG. 7 is a cross sectional view illustrating a lighting fixture according to further embodiments of the present invention.

FIG. 7 illustrates a light fixture 700 incorporating embodiments of the present inventive subject matter. As used herein, the term light fixture includes devices that are classified under UL 1598 safety standard. As seen in FIG. 7, the light fixture 700 includes discrete lumiphor-containing regions 710 on a remote surface 712. The light fixture 700 also includes one or more solid state light sources 720, such as LEDs, a power supply 722 and a heat sink 724. While a lay-in fixture, such as the LR24 from Cree LED Lighting, is illustrated in FIG. 7, other light fixtures may be provided. For example, downlights, wall washer, pendants, surface mount or other types of fixtures may be provided.

Figure 8:
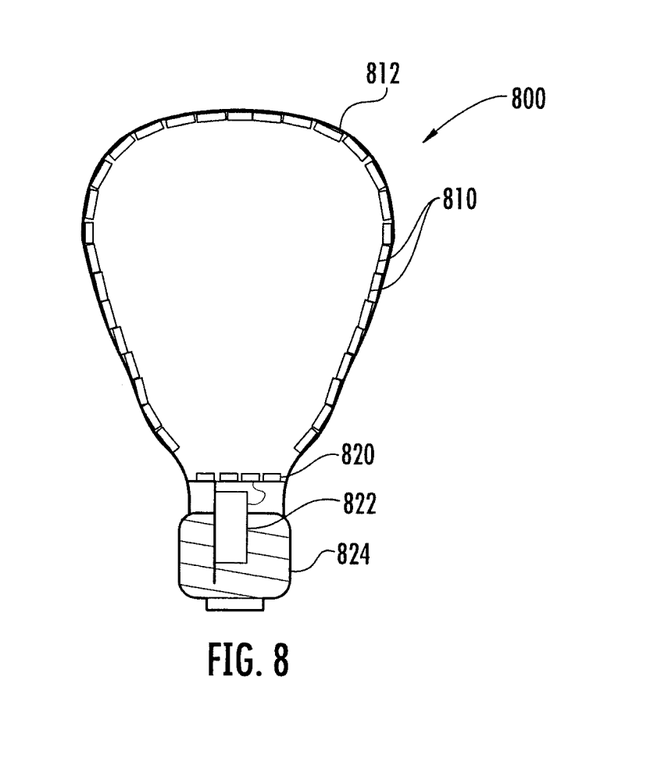
FIG. 8 is a cross sectional view illustrating a self-ballasted lamp according to further embodiments of the invention.

As seen in FIG. 8, a lighting device according to embodiments of the present inventive subject matter may be provided as a self-ballasted lamp 800, such as an A-lamp. The lamp of FIG. 8 includes discrete lumiphor-containing regions 810 on a remote surface 812. The lamp 800 also includes one or more solid state light sources 820, such as LEDs, a power supply 822 and a connector 824. The connector 824 is illustrated as an Edison screw-base, however, other connector types, such as a pin base or GU-24 base, could also be utilized. Furthermore, while the lamp 800 is illustrated as an A-lamp, other lamp configurations may be provided, such as a PAR or BR lamp or non-standard lamp configurations. As used herein, a self-ballasted lamp includes lamps that are classified under UL 1993 safety standard.

Figure 9:
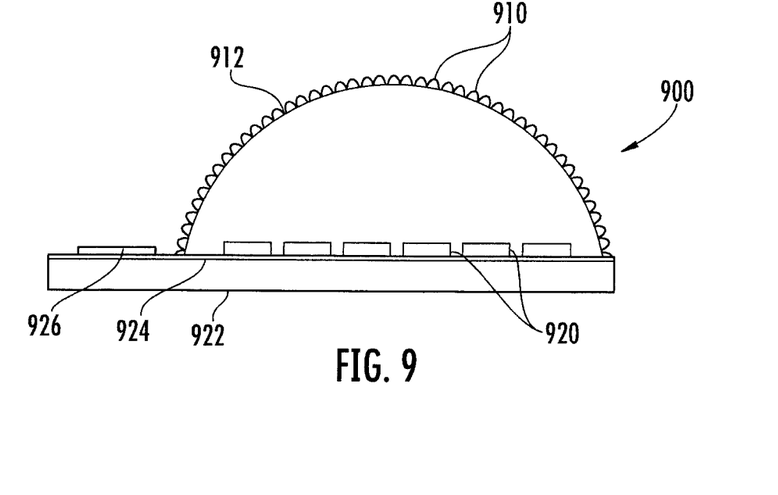
FIG. 9 is a cross sectional view illustrating a light emitting device module according to further embodiments of the invention.

The lighting device according to embodiments of the present inventive subject matter illustrated in FIG. 9 is provided as a module 800. As used herein, an LED module refers to multiple interconnected LEDs on a circuit board or other substrate but does not include a power supply. The module 900 of FIG. 9 includes discrete lumiphor-containing regions 910 on a remote surface 912. The module 900 also includes component solid state light sources 920, such as component LEDs, a substrate 922, an insulating/interconnection structure 924 and contact pads 926.

Figure 10:
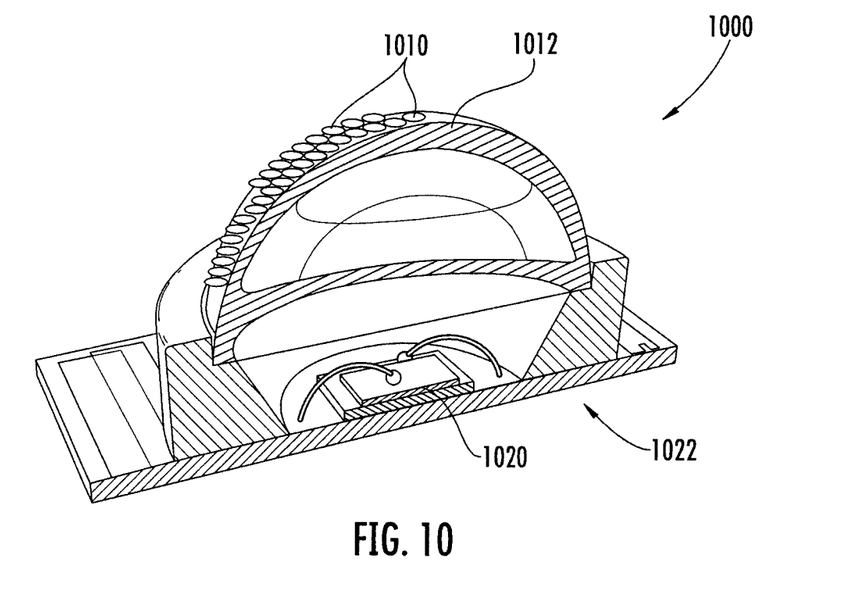
FIG. 10 is a cross sectional view illustrating a component according to further embodiments of the invention.

FIG. 10 illustrates a component 1000 incorporating embodiments of the present inventive subject matter. As seen in FIG. 10, the component 1000 includes discrete lumiphor-containing regions 1010 on a remote surface 1012. The component 1000 also includes one or more solid state light sources 1020 and a component package 1022. Such component packages may include multiple LED die, such as is provided by the X Lamp and MC components provided by Cree, Inc. of Durham, N.C. The discrete lumiphor-containing regions 1010 may be provided on a lens of the component or may be on a separate structure.

The discrete lumiphor-containing regions illustrated in FIGS. 7 through 10 are illustrated as being provided on light transmitting structures. However, the discrete lumiphor-containing regions may be provided on opaque surfaces as well. For example, the discrete lumiphor-containt regions 710 in FIG. 7 may be provided on the slanted surfaces between the LEDs 720 and the remote surface 712. These opaque surfaces may be highly reflective to improve overall system efficacy. Likewise, combinations of reflective and transmitting structures may also be provided. These reflective and transmitting structures may be provided as separate or combined structures.

While particular embodiments are described herein, various combinations and sub-combinations of the structures described herein are contemplated and will be apparent to a skilled person having knowledge of this disclosure.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A lighting device, comprising:
    a semiconductor light emitting device (LED) configured to emit light having a first peak wavelength upon the application of a voltage thereto;
    an element in adjacent, spaced-apart relationship with the LED;
    a pattern of discrete lumiphor-containing regions within or on a surface of the element, wherein the lumiphor-containing regions are spaced apart from each other, wherein the lumiphor-containing regions are configured to receive light emitted by the LED and to convert at least a portion of the received light to light having a different wavelength than the first peak wavelength; and
    an intermediate material between at least some of the adjacent ones of the lumiphor-containing regions, wherein the intermediate material comprises reflective material capable of reflecting the light at the first peak wavelength.

2. The lighting device of claim 1, wherein the element comprises a lens.

3. The lighting device of claim 1, wherein the element comprises a reflective element.

4. The lighting device of claim 1, wherein the pattern of discrete lumiphor-containing regions comprises a plurality of first and second lumiphor-containing regions, wherein the first lumiphor-containing region is configured to convert light emitted by the LED to light having a second peak wavelength and the second lumiphor-containing region is configured to convert light emitted by the LED to light having a third peak wavelength, shorter than the second peak wavelength.

5. The lighting device of claim 4, wherein the first peak wavelength comprises a blue or UV wavelength, wherein the first discrete lumiphor-containing regions comprise a first color phosphor and wherein the second discrete lumiphor containing regions comprise a second color phosphor.

6. The lighting device of claim 1, wherein the lighting device comprises a component.

7. The lighting device of claim 1, wherein the lighting device comprises a module.

8. The lighting device of claim 1, wherein the lighting device comprises a self-ballasted lamp.

9. The lighting device of claim 1, wherein the lighting device comprises a light fixture.

10. A lighting device, comprising:
    a semiconductor light emitting device (LED) configured to emit light having a first peak wavelength upon the application of a voltage thereto;
    a lens in adjacent, spaced-apart relationship with the LED;
    a pattern of discrete lumiphor-containing regions on a surface of the lens, wherein the pattern of discrete lumiphor-containing regions comprises a plurality of first and second lumiphor-containing regions spaced apart from each other, wherein the first lumiphor-containing region is configured to convert light emitted by the LED to light having a second peak wavelength and the second lumiphor-containing region is configured to convert light emitted by the LED to light having a third peak wavelength, shorter than the second peak wavelength; and
    an intermediate material between at least some of the adjacent ones of the spaced apart first and second discrete lumiphor containing regions, wherein the intermediate material comprises reflective material capable of reflecting the light at the first peak wavelength.

11. A lighting device, comprising:
    a semiconductor light emitting device (LED) configured to emit light having a first peak wavelength upon the application of a voltage thereto;
    a reflective element in adjacent, spaced-apart relationship with the LED;
    a pattern of discrete lumiphor-containing regions on a surface of the reflective element, wherein the pattern of discrete lumiphor-containing regions comprises a plurality of first and second lumiphor-containing regions spaced apart from each other, wherein the first lumiphor-containing region is configured to convert light emitted by the LED to light having a second peak wavelength and the second lumiphor-containing region is configured to convert light emitted by the LED to light having a third peak wavelength, shorter than the second peak wavelength; and
    an intermediate material between at least some of the adjacent ones of the spaced apart first and second discrete lumiphor containing regions, wherein the intermediate material comprises reflective material and/or refractive material.

12. A lighting device, comprising:
    a semiconductor light emitting device (LED) configured to emit light having a first peak wavelength upon the application of a voltage thereto;
    an element in adjacent, spaced-apart relationship with the LED;
    a pattern of discrete lumiphor-containing regions within the element, wherein the lumiphor-containing regions are spaced apart from each other, wherein the lumiphor-containing regions are configured to receive light emitted by the LED and to convert at least a portion of the received light to light having a different wavelength than the first peak wavelength; and
    an intermediate material between at least some of the adjacent ones of the lumiphor-containing regions, wherein the intermediate material comprises reflective material capable of reflecting the light at the first peak wavelength.

13. The lighting device of claim 12, wherein the element comprises a lens.

14. The lighting device of claim 13, wherein the pattern of discrete lumiphor-containing regions comprises a plurality of first and second lumiphor-containing regions, wherein the first lumiphor-containing region is configured to convert light emitted by the LED to light having a second peak wavelength and the second lumiphor-containing region is configured to convert light emitted by the LED to light having a third peak wavelength, shorter than the second peak wavelength.

15. The lighting device of claim 14, wherein the first and second discrete lumiphor-containing regions are spaced apart from one another within the element.

16. The lighting device of claim 1, wherein the pattern of discrete lumiphor-containing regions are within and on a surface of the element.

* * * * *